United States Patent [19]

Mead et al.

[11] Patent Number: 4,771,196

[45] Date of Patent: Sep. 13, 1988

[54] ELECTRONICALLY VARIABLE ACTIVE ANALOG DELAY LINE

[75] Inventors: Carver A. Mead, Pasadena; Richard F. Lyon, Los Altos, both of Calif.

[73] Assignee: California Institute of Technology, Pasadena, Calif.

[21] Appl. No.: 81,861

[22] Filed: Aug. 5, 1987

[51] Int. Cl.[4] .................. H03K 5/159; H03K 5/00; H03K 5/13; G06G 7/12

[52] U.S. Cl. .................. 307/605; 328/127; 328/55; 307/590; 307/595; 307/597; 307/602; 307/603; 307/608; 307/490; 307/493; 307/497

[58] Field of Search .............. 307/590, 593, 595, 597, 307/602, 603, 605, 606, 608, 490, 493, 491, 497, 552, 553, 264, 555, 558, 562; 328/172, 173, 209, 221, 175, 55, 191, 192, 193, 127, 128

[56] References Cited

U.S. PATENT DOCUMENTS 3,622,809 11/1971 Williams .................. 328/55
3,633,043 1/1972 Anthony .................. 307/562
4,641,048 2/1987 Pollock .................. 328/128

Primary Examiner—Stanley D. Miller
Assistant Examiner—Trong Q. Phan
Attorney, Agent, or Firm—Freilich, Hornbaker, Rosen & Fernandez

[57] ABSTRACT

An electronically variable active analog delay line utilizes cascaded differential transconductance amplifiers with integrating capacitors and negative feedback from the output to the input of each noninverting amplifier. The delay of each section may be controlled through a conductor having distributed resistance connected at distributed points to the transconductance control terminal of the amplifiers with a controllable voltage gradient between the two ends of the conductor. Signals may be coupled in and added to a propagating signal using capacitors, or transconductance amplifiers which may also be of the differential transconductance type, particularly when coupling signals from a second delay line having substantially the same propagation velocity. The differential transconductance amplifiers may be arranged in pairs, each pair with positive feedback from the output terminal of the second to the input terminal of the first amplifier of the pair through a third differential amplifier with positive feedback from its own output terminal. The transconductances of the cascaded amplifiers are controlled in each section to produce the desired time-constant (delay) of the section, and the transconductance of the positive feedback amplifier is controlled for stable operation and gain control of the section.

17 Claims, 11 Drawing Sheets $I_{SAT} \simeq (V_{GS} - V_T)^2$ $V_T$ = THRESHOLD VOLTAGE

ELECTRONICALLY VARIABLE ACTIVE ANALOG DELAY LINE

BACKGROUND OF THE INVENTION

This invention relates to an analog integrated circuit delay line using micropower techniques, and more particularly to an electronically variable analog delay line implemented with very large scale integrated circuit (VLSI) technology.

Integrated circuits using micropower (0.5 µW at 1.5 V) techniques have been used first for digital watches and pocket calculators, some having so many functions as to require sophisticated architectures very much like large processors. The use of micropower techniques has since been extended to integrated circuits that more directly affect the health and well being of man, such as pacemakers and hearing aids. But in both of those applications, the integrated circuits are designed to merely assist the sophisticated systems of man, and not to supplant them.

A "stone deaf" person who has lost all functions of the cochlea cannot be helped by a hearing aid. He requires, instead, a complete and independent hearing system. Similarly, the vision of a blind person cannot be aided by electronic devices, but must instead be supplanted with a complete and independent system. In order that such systems be developed, auditory and visual signal processing by the cochlea and the retina must first be analyzed and synthesized for research. It may be possible to synthesize a system that supplants the inoperable system of man for the deaf or the blind.

Notwithstanding such a laudable goal for helping man, the electronically variable active analog delay line that is the subject of this invention will have other, and possibly more readily applicable uses. Consequently, the objects of this invention should be construed broadly, notwithstanding reference to its application to electronically emulating the operation of the cochlea.

OBJECTS AND SUMMARY OF THE INVENTION

An object of the invention is to provide an analog delay line with a delay that is electronically adjustable over many orders of magnitude.

A further object of the invention is to provide means for coupling input signals into such an electronically adjustable delay line.

A further object of the invention is to provide means for coupling a signal propagating in one such delay line into another such delay line, the two delay lines having approximately the same velocity of propagation.

A further object of the invention is to provide an analog delay line with propagation velocity that is an exponential function of the distance along the line.

A still further object of the invention is to provide positive feedback in such an exponential delay line for increasing the performance thereof.

Yet another object of this invention is to synthesize a model cochlea with an electronically variable delay line included in a single analog integrated circuit.

In accordance with the present invention, an electronic delay line is provided as a transmission line with electronically controllable delay through each of a plurality of cascaded delay sections. Each delay section comprises a follower-integrator. Each follower-integrator comprises a differential transconductance amplifier for charging a capacitor C in accordance with the equation:

$$C \frac{dV_{out}}{dt} = I_G \tanh (V_{in} - V_{out})$$

where $I_G/G = kT/q\kappa \approx 40 mv$, and G is a transconductance parameter set by a first bias voltage. A first conterol line having distributed resistance proportions that bias voltage applied to each section in accordance with the position of the section in a delay line for control of delay per section of the line.

The novel features that are considered characteristic of this invention are set forth with particularity in the appended claims. The invention will best be understood from the following description when read in connection with the accompanying drawings.

DESCRIPTION OF PREFERRED EMBODIMENTS

Figure 1:
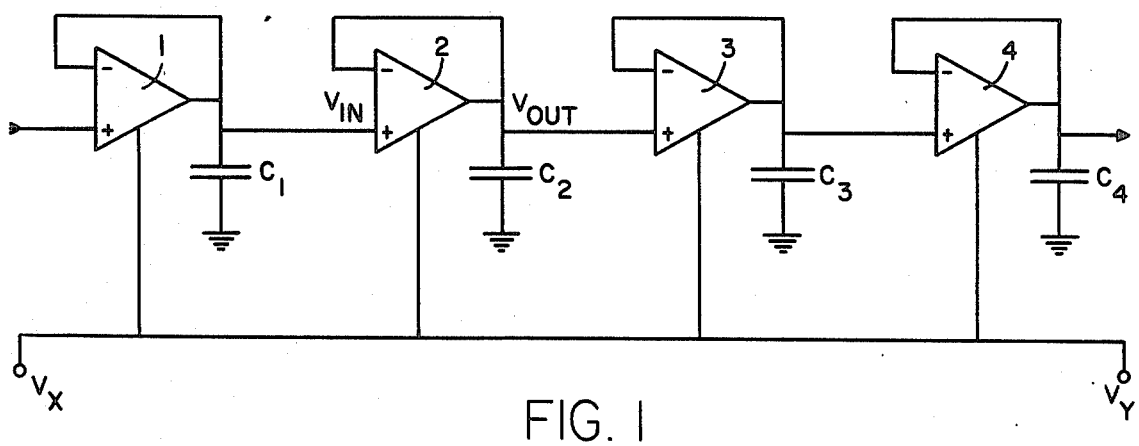
FIG. 1 illustrates a basic, electronically variable, active analog delay line in accordance with the present invention.
Figure 2:
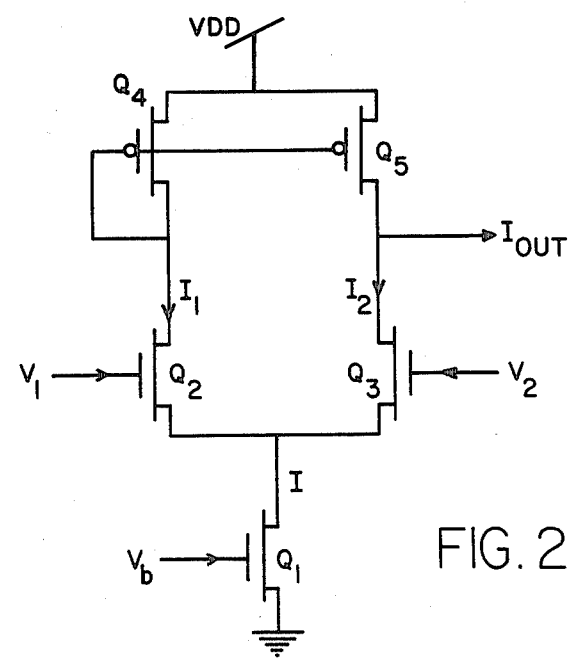
FIG. 2 illustrates a basic transconductance amplifier useful for implementing the present invention.

The electronically variable active delay line that is the basic object of this invention is illustrated in FIG. 1 as having four stages of differential transconductance amplifiers 1 through 4 with integrating capacitors $C_1$ through $C_4$ at the respective output terminals. Each amplifier employs both p-channel and n-channel transistors as shown in FIG. 2.

Figure 3A:
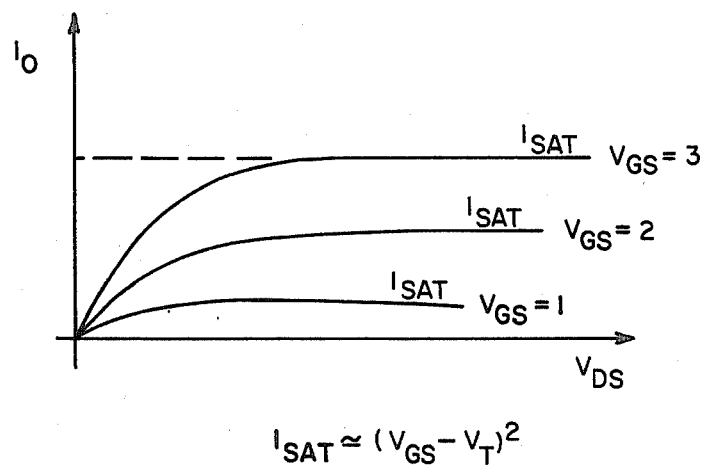
FIG. 3a illustrates a plot of drain current of a CMOS transistor as a function of a drain-source voltage $V_{DS}$ for various values of gate-source voltage $V_{GS}$, and FIG. 3b defines "threshold" voltage, $V_T$, for the operation of a CMOS transistor in a plot of the square root of drain current at saturation of $\sqrt{I_{SAT}}$, as a function of a gate-source voltage $V_{GS}$.
Figure 3B:
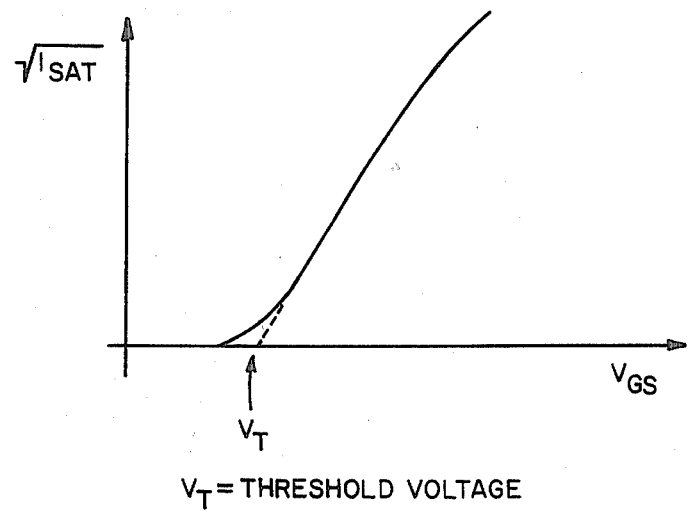

A feature of all circuits to be described is that they are biased such that they operate below their threshold voltage, $V_T$. Normally, transistors are operated above threshold, such that saturation current is given by:

$$I_{SAT} \approx (V_{GS} - V_T)^2, \qquad (1)$$

as shown in FIG. 3a for various values of gate voltage $V_G$. Upon plotting the square root of $I_{SAT}$ as a function of gate-source voltage $V_{GS}$ from Equation (1), and projecting the linear portion of the curve to the axis of $V_{GS}$, a value is determined which corresponds to the transistor threshold voltage.

For the micropower circuits to be described, the transistors in the amplifiers are operated below threshold voltage $V_T$, where their IV characteristics are exponential. In this range of operation the drain current saturates after the drain-source voltage exceeds a few tenths of a volt, and is exponential in the gate-source voltage. By operating the transistors in this subthreshold range, all analog circuits can be operated on the conventional 5 volt power supply used for digital circuits.

Referring to FIG. 2, the transconductance, G, of the amplifier is set by a bias voltage, $V_b$, applied to a transistor $Q_1$. For a given bias voltage, the transistor will generate a constant bias current I. In practice the bias voltage is derived from a current mirror used to set the current level for the entire VLSI system in order that the bias current be constant.

For a given bias voltage, $V_b$, transistor $Q_1$ will generate a bias current I. If the two input voltages $V_1$ and $V_2$ are exactly equal, and the transistors $Q_2$ and $Q_3$ are exactly matched, the current through the transistor $Q_1$ divides equally through the transistors $Q_2$ and $Q_3$. The current $I_1 = I/2$ coming out of the drain of the transistor $Q_2$ must be supplied by the transistor $Q_4$. The gate of the transistor $Q_4$ will be pulled down until I/2 flows out of the drain of the transistor $Q_4$. Since that is a p-channel transistor, its gate is made more negative then its source at $V_{DD}$ to turn it on. In the process of turning transistor $Q_4$ on, the more negative voltage on the gate of transistor $Q_4$ is also applied to the gate of the transistor $Q_5$ to turn it on. Because the transistor $Q_5$ is identical to the transistor $Q_4$, it will also conduct I/2, supplying the drain current $I_2 = I/2$ of transistor $Q_3$. The output current $I_{OUT}$ is therefore zero, as expected, since $V_1 = V_2$.

If $V_1$ is not equal to $V_2$, and $V_2$ is negative with respect to $V_1$, more current flows through transistor $Q_2$ than through transistor $Q_3$. The difference between this case and the case of $V_1 = V_2$ is designated $\epsilon$. The current $(I/2) + \epsilon$ through transistor $Q_4$ produces an identical current through transistor $Q_5$. In addition the transistor $Q_3$ which has its gate voltage more negative than the transistor $Q_2$ will conduct less current than when $V_1 = V_2$. The difference there is equal to $\epsilon$, so that the output current $I_{OUT} = 2\epsilon$. If $V_1$ is negative with respect to $V_2$, the sign of the difference $\epsilon$ will be negative and the output is $-2\epsilon$.

The characteristic of the transconductance amplifier of FIG. 2 operating in subthreshold is exponential, as will be described more fully with reference to FIG. 4, and is derived in the following manner:

$$I_{OUT} = e^{V_1 - V} - e^{V_2 - V} = e^{-V}(e^{V_1} - e^{V_2}) \qquad (2)$$

$$I = e^{V_1 - V} + e^{V_2 - V} = e^{-V}(e^{V_1} + e^{V_2}) \qquad (3)$$

$$I_{OUT} = I \frac{e^{V_1} - e^{V_2}}{e^{V_1} + e^{V_2}} \qquad (4)$$

Multiplying both the numerator and denominator of Equation (4) by $$e^{-(V_1 + V_2)/2},$$

to express every exponent in terms of voltage differences, the result is:

$$I_{OUT} = I \tanh\left(\frac{V_1 - V_2}{2}\right) \qquad (5)$$

The tanh differential transfer function ideally passes through the origin with unity slope and becomes saturated with an input voltage differential of about ±0.2 volts. If there is a mismatch between transistor characteristics, the tanh differential transfer function will have the same shape but at $V_2 - V_1 = 0$ the output current $I_{OUT}$ will not be zero, and will instead be slightly positive, or negative as in the example illustrated in FIG. 4. The input offset is typically about 20 mV. However, VLSI circuits can be designed to tolerate such variations.

Figure 4:
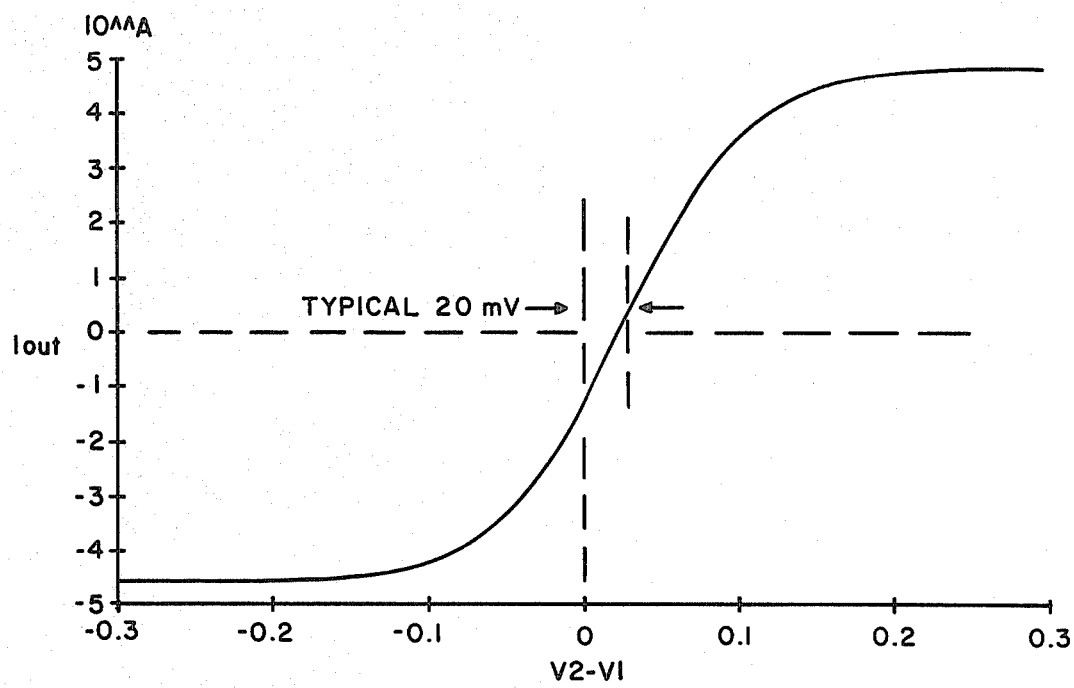
FIG. 4 illustrates in a graph the tanh transfer characteristic of the transconductance amplifier of FIG. 2, and illustrates an offset of the characteristic curve due to usual mismatch of transistors in an integrated circuit implementation of the amplifier.

The tanh transfer characteristic of the transconductance amplifier limits its dynamic range of differential input signals for which linear behavior can be obtained to a range of approximately ±100 mV, as shown in FIG. 4. For certain applications, it is possible to limit the input voltage difference to any one amplifier, and still process signals of much larger amplitude. All circuits described hereinafter have the feature that they use the collective property of a collection of many amplifiers to process signals of amplitude limited only by the power supply $V_{DD}$.

Figure 5:
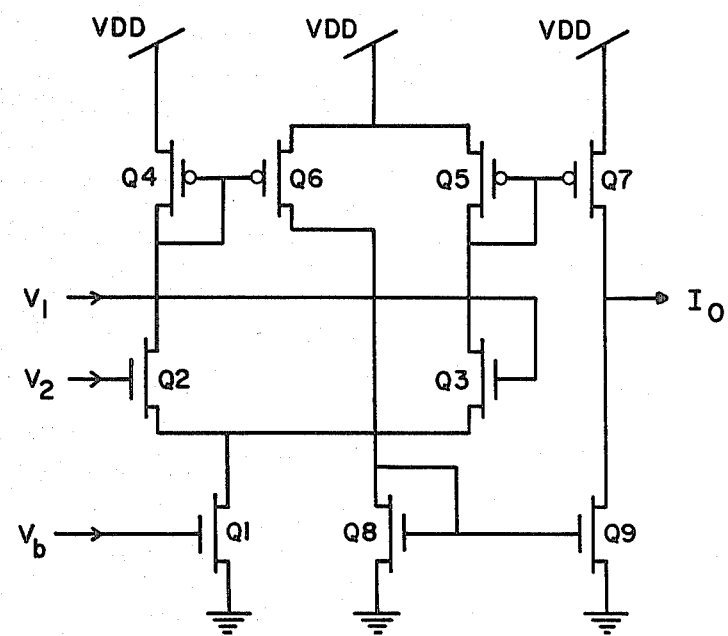
FIG. 5 is a circuit diagram of a transconductance amplifier that is preferred for implementation of the present invention in order to expand the range of minimum input signals values that may be amplified.

The simple differential transconductance amplifier of FIG. 2 will not operate below some minimum value of input voltages relative to the output voltage. To remove this restriction on range, transistors $Q_6-Q_9$ are added as shown in FIG. 5. The current mirror transistors $Q_4$ and $Q_5$ (which in FIG. 2 mirror the current $I_1$ of transistor $Q_2$ to the output node) have been turned into parts of two current mirrors so they set the voltage for the gates of transistors $Q_6$ and $Q_7$. The currents out of the transistors $Q_6$ and $Q_7$ are equal to the two halves of the current in the differential pair of transistors $Q_2$ and $Q_3$. The current out of the transistor $Q_6$ is then reflected one more time through transistors $Q_8$ and $Q_9$ to subtract it from the current out of the transistor $Q_7$ to form the desired output current for the differential input $V_1-V_2$.

If the input signals $V_1$ and $V_2$ are equal, the drain currents of transistors $Q_2$ and $Q_3$ are equal, and are reflected equally so the drain current of transistor $Q_7$ is the same as the drain current of transistor $Q_6$ which is reflected through transistor $Q_8$ and $Q_9$, so the current through transistor $Q_9$ is the same as the current through transistor $Q_7$ and the output current is zero. If $V_2$ is a little more positive than $V_1$, more current flows through transistor $Q_4$ and thus more through transistor $Q_6$, and in turn more through transistors $Q_8$ and $Q_9$. As a consequence, there is a net current coming into the output node from outside the circuit, i.e., a negative output current is produced. Note that the inputs labeled $V_1$ and $V_2$ have been interchanged in FIG. 5 relative to FIG. 2 so that in either circuit a more positive $V_1$ will cause a positive output current. With that in mind, the transconductance amplifier of FIG. 5 can replace the one of FIG. 2 in a circuit such as the delay line shown in FIG. 1. The input signals $V_1$ and $V_2$ can then increase almost to $V_{DD}$, and decrease almost to circuit ground, and the output voltage can be anywhere in that range. In other words, the output voltage of the transconductance amplifier of FIG. 5 can be anywhere in the range from almost zero to almost $V_{DD}$, which is a wide range for the amplifier.

Referring once again to FIG. 1, it should be noted that each of the transconductance amplifiers functions with its associated output capacitor as a follower-integrator circuit. That is, for high frequencies or fast variations the circuit behaves as an integrator or smoother, while for low frequencies or slow variations it behaves as a follower. The current into the capacitor is proportional to the tanh of difference between the amplifier's input signal $V_{IN}$ at its positive input terminal, and its output signal $V_{OUT}$ at its negative input terminal. The rate at which $V_{OUT}$ is able to respond to changes in $V_{IN}$ is set by the transconductance G of the amplifier in accordance with the following equation:

$$C \frac{dV_{OUT}}{dt} = I_G \tanh(V_{IN} - V_{OUT}) \quad (6)$$

For small signals, tanh can be approximated by its argument, and Equation (6) becomes $$C \frac{dV_{OUT}}{dt} = I_G (V_{IN} - V_{OUT}) \quad (7)$$

which can be written in LaPlace transforms as:

$$\frac{V_{OUT}}{V_{IN}} = \frac{1}{\tau s + 1} \quad (8)$$

where $\tau = C/G$. The response of the integrator-follower to a step input is very nearly the same as the response of an RC integrator; the two responses are not distinguishably different for a small signal ($\approx 40$ mV). The temporal-smoothing properties of a single time-constant, such as Equation (8), can be defined as $$V_{OUT}(t) = \int_0^\infty V_{IN}(t - \delta t)e^{-\delta t/\tau} d\delta t \quad (9)$$

which states that the output at any time t is made up of the input for all previous times, but the contribution of the input of any given time decreases exponentially with time into the past. And since $\tau$ is a function of C (a constant) and G, which is a variable that can be controlled through the bias voltage $V_b$, as described with reference to FIG. 2, the result is that the circuit of FIG. 1 is an electronically variable active analog delay line having four cascaded delay sections.

The small-signal transfer function of the follower-integrator, comprising a transconductance amplifier connected as a follower, with its output driving a capacitor, is identical to that of an RC integrator to time-varying signals, but it has more properties than just its transfer function. A principal property is that when cascaded, each delay section responds independent of adjacent sections due to the isolation provided by the transconductance amplifier. In a corresponding delay line comprised of cascaded RC circuits, each section does not respond independent of adjacent sections due to the fact that all of the current for each section must be supplied through the input terminal of the first section. By including a transconductance amplifier as an active element at each section, the delay line can respond to an input signal applied to the first section without depending on the energy of that signal; each section has its own source of energy for charging its capacitor. As a consequence, signals can be coupled into any section and added to a signal being propagated through that section in the delay line.

Figure 1A:
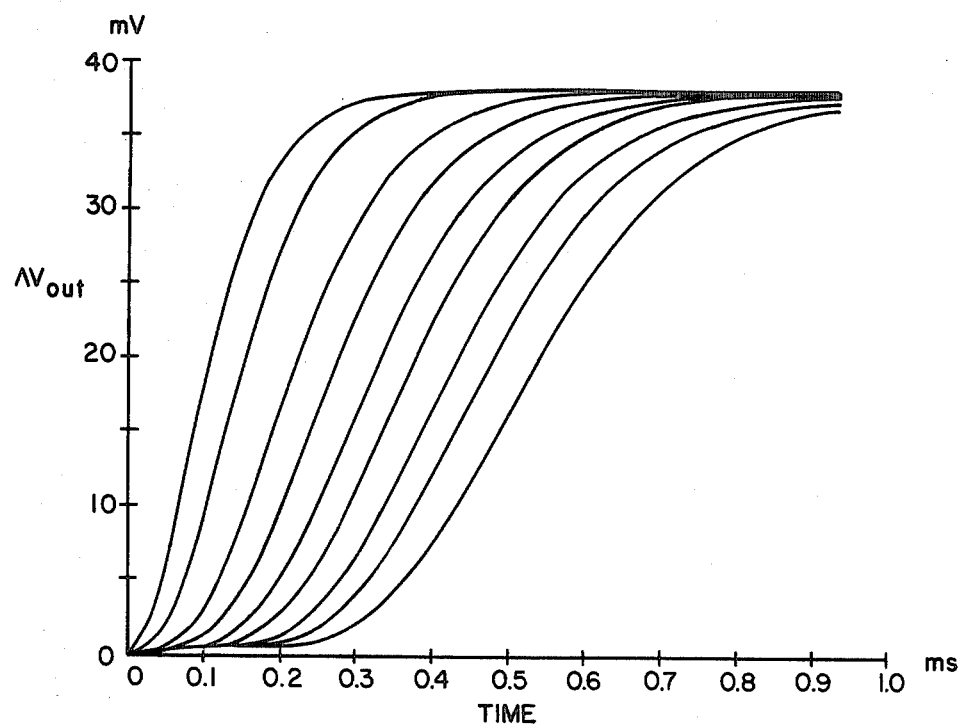
FIG. 1a illustrates measured response at the outputs of ten cascaded sections of a delay line.
Figure 6:
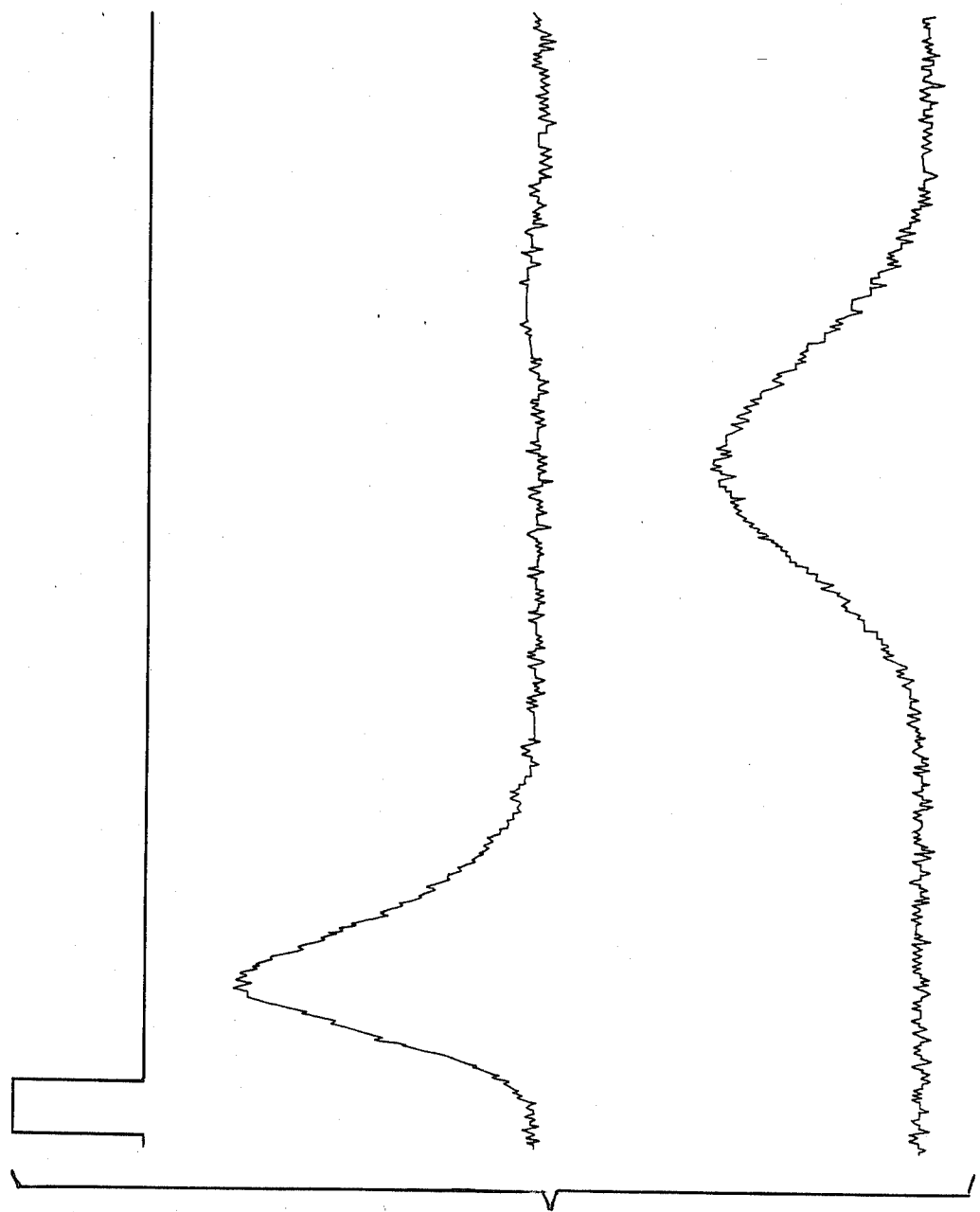
FIG. 6 illustrates the transfer function of the delay line of FIG. 1 to a short pulse at two taps, i.e., at the output of two different delay sections.

The delay line implemented with first-order follower-integrators, as shown in FIG. 1, provides a sigal delay proportional to the number of sections, as shown in FIG. 1a for ten cascaded sections. The spacing between the response curves of any two adjacent output taps is the delay of the section between the taps. That delay is not exactly the same for all sections due to transistor mismatch in the transconduction amplifier used to implement the followerintegrator. The bandwidth of the delay line decreases as the square-root of the number of sections. It is thus ideally suited to applications where the input signal is required to be both delayed and smoothed, but not perceptably attenuated. When a single input signal is present, and it is desired to process several versions of the signal that have been delayed and filtered to various degrees, the outputs of several stages along the line can be tapped for this purpose. The responses to a short pulse at two taps are shown in FIG. 6.

Figure 1B:
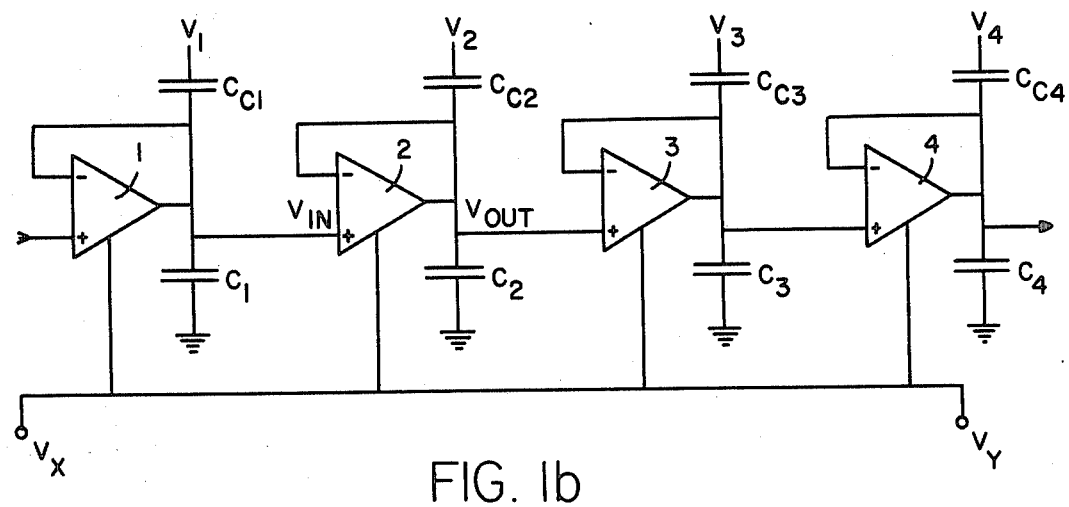
FIG. 1b illustrates how other signals may be coupled by capacitors into different sections of the delay line of FIG. 1 and combined with signals being propagated.
Figure 1C:
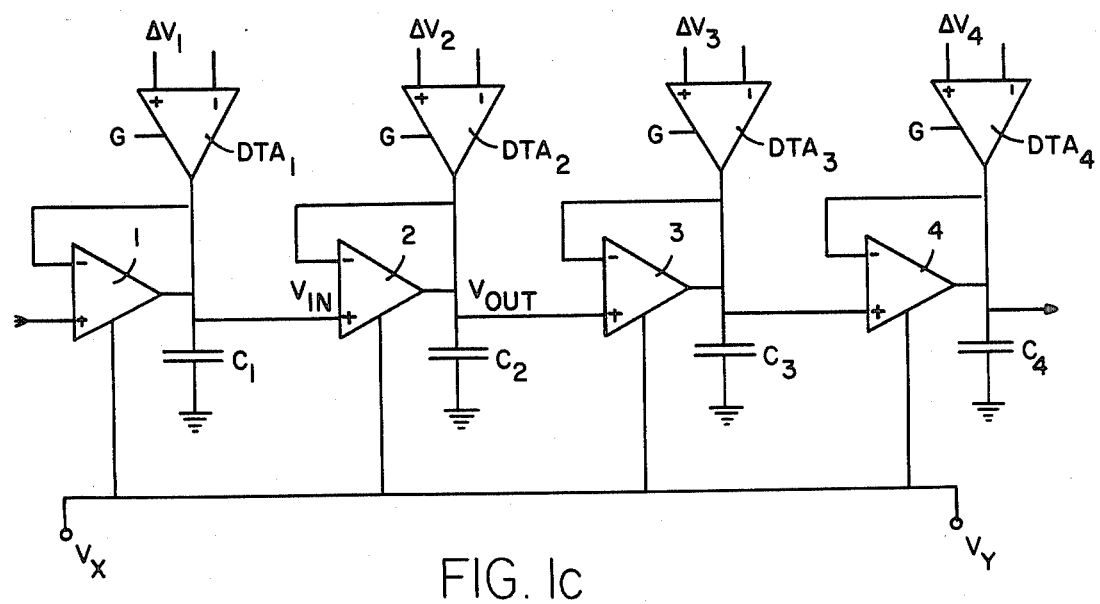
FIG. 1c illustrates a second method of coupling signals into different sections of a delay line using differential transconductance amplifiers.

When a plurality of input signals are present, and it is desired to subject the signals to separate delay and filtering functions before combining them, such as when synthesizing the effects of sound arriving from several directions, the delay line of FIG. 1 can be used to accomplish that by coupling each of the input signals into the delay line at appropriate taps using coupling capacitors $C_C$ as shown in FIG. 1b. When each of the input signals to be combined is represented as a voltage difference between two input signals, a differential transconductance amplifier DTA may be used at appropriate taps, as shown in FIG. 1c. These amplifiers inject current into the appropriate tap on the delay line. The strength of the coupling is controlled by the transconductance G of the coupling amplifier DTA which can be separately and electronically controlled for each voltage difference input.

Figure 1D:
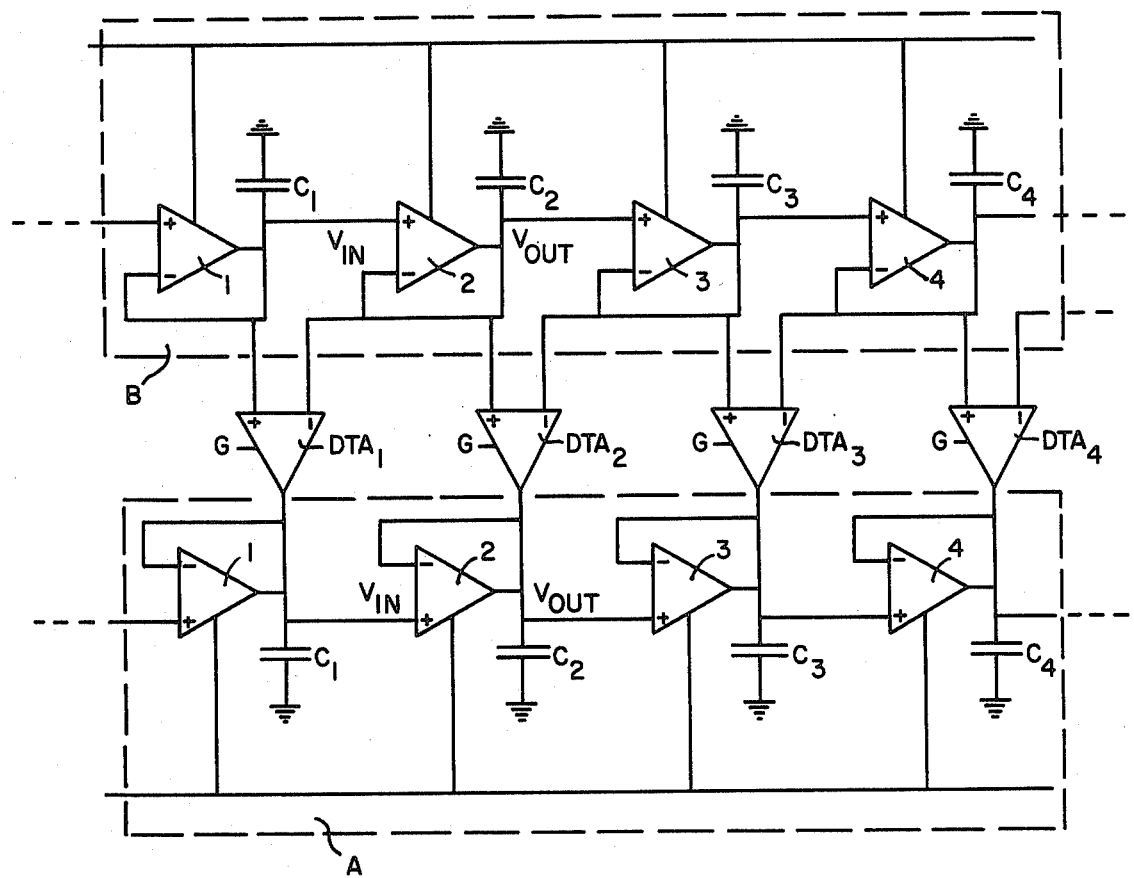
FIG. 1d illustrates the use of the technique illustrated in FIG. 1c for coupling two delay lines.

An example of how the delay line of FIG. 1c may be used is shown in FIG. 1d. There a signal processed by a first delay line A is to be combined with a signal processed by a second delay line B, with only the difference between the outputs of successive sections in the second delay line and the next section of each is to be combined with the signals at the outputs of successive sections of the first delay line. Again the extent of the coupling at each stage by a transconductance amplifier DTA at each stage may be separately and electronically controlled. If the velocity of propagation is substantially the same in both delay lines, a signal propagating in the second delay line B will build up in the first delay line A. The extent of coupling is proportional to the transconductance G of each coupling amplifier DTA, and to the number of sections coupled. The resultant signal in the first delay line A is the sum of the signal propagating in the first delay line A, and the signal coupled from the second delay line B.

It should be noted that the active directional couplers, each comprised of a differential transconductance amplifier DTA, allows the addition of two signals that are much larger than the 100 mV range of the micropower amplifiers themselves. An example of the application of such active directional couplers is a reverberation system for simulating the reflection of sounds, such as from walls in a room. Each reflection can be modeled by summing the properly delayed signal with the rest of the sound in the room. Another example is creating new sounds from a musical instrument, such as an electric guitar. The degree of reverberation used to create the new sound could be readily controlled by control of the transconductance G of the coupling amplifiers, either in unison or separately, to vary the extent to which the new sound departs from the basic sound of the instrument.

Figure 7:
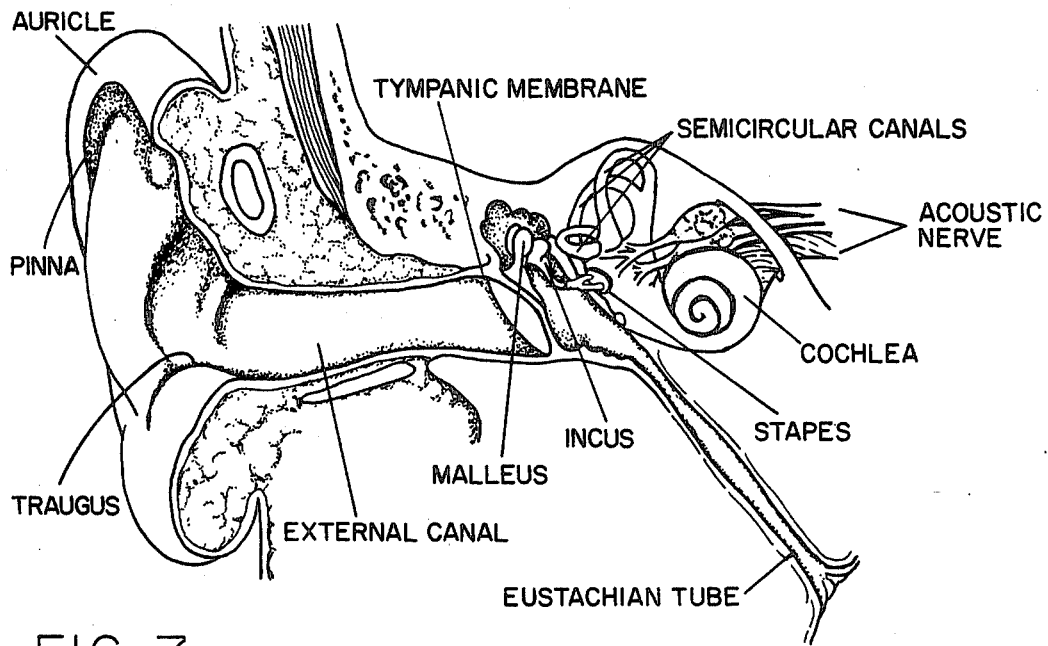
FIG. 7 is a sectional view of the inner and outer ear of a human to illustrate the relationship of the cochlea to the tympanic membrane which receives acoustic pressure waves and the acoustic nerves which communicate to the brain sounds transformed from pressure waves into electrical signals.

Application of the electronically variable active analog delay line to the simulation of the cochlea in the human ear will now be discussed with reference to FIG. 7, which illustrates a cross section of the outer ear, the inner ear, and the canal that connects the two. A tympanic membrane (eardrum) terminates the external canal. That membrane is connected to a little bone, the malleus (hammer), which in turn is connected to the stapes (stirrup) through the incus (anvil). The stapes pushes on a membrane over an oval window into the cochlea (inner ear).

Auditory psychophysiological research has led to an understanding of sound localization by humans that has made sound synthesis possible. Such research has succeeded in quantifying the acoustic cues that humans use for sound localization. Using these cues, it is possible to synthesize sounds appearing to have come from arbitrarily specified directions. The cues used are a consequence of the interaction of sounds with the physical environment. The sound to be sensed by both ears must propagate through the air an around the head. The sound is then reflected by the pinna and tragus of the outer ear before entering the external canal and arriving at the eardrum and the inner ear. The modifications of the sound in its journey through different paths to the right and left inner ears provide the cues to the horizontal and vertical direction of the sound source.

Localization of sound in the vertical direction is made possible by the pinna and tragus of the outer ear. Incoming sound may enter the ear canal via two paths that differ in length. One path is as direct as possible, given the shape of the outer ear. The other path is more tortuous; the incoming sound bounces from the pinna to the tragus and then into the ear canal. The signals traversing the two paths combine in the ear canal. The difference in path length between the two signals can be measured in psychoacoustic experiments as a notch in the spectral sensitivity function due to destructive interference when the increase in path length due to pinna-tragus reflection is one-half wavelength of the incoming sound. The time delay between the two paths is a function of elevation. The shape of the outer ear is unique in every individual, so the absolute values of the time delays vary. However, for all people, the size of the time delay a monotonic function of elevation, with small delay at high elevations and larger delay at low elevations. Typical values of time delay are 35–80 $\mu$sec.

Coupling the sound from the oval window to the brain is the cochlea which is coiled like a snail to conserve linear space.

The cochlea is divided into three parallel chambers filled with fluid. One chamber is called the scala tympani because it is driven by sound waves from the tympanic membrane, via the oval window. The top chamber, called the scala vestibuli connects to the scala tympani at the far end so that a pressure wave produced by the stopes at the oval window returns through the scala vestibuli. Between the scala vestibuli and the scala tympani is the scala media, a most important chamber containing the necessary transducers for converting pressure waves to electrical signals. The pressure of differential waves between the fluid in the scala media and the scala tympani is sensed by the Organ of Corti on the basilar membrane between the two.

As the stapes pushes on the oval window, a pressure wave begins to move through the scala tympani, thus deforming the basilar membrane upward, much the same as a traveling wave deforms the surface of a liquid in a trough. If the basilar membrane is thick and tight, the wave will travel very fast, and if thin and loose, the wave will travel very slow, by control of the basilar membrane properties, the velocity of wave propagation can be controlled.

It should be noted that hearing starts by spreading out the sound along a continuous traveling wave structure. The velocity of propagation is a nearly exponential function of the distance along the membrane. It starts out near the oval window with very high velocity of propagation. That is done by providing a very tight thick basilar membrane. As the signal travels toward the opposite end, away from the oval window, the basilar membrane gets thinner and thinner, so the velocity of propagation slows down. The velocity of propagation changes by about a factor of 100 along the length of the cochlea.

The function of the Organ of Corti connected to the basilar membrane is to get audio signals out of the inner ear and into the brain. As a pressure wave travels along the cochlea, it will bend the basilar membrane up and down so that it will move relative to the tectarial membrane, thus converting up and down motion on the basilar membrane to shearing motion between it and the tectorial membrane.

A small row of cells, called the "inner hair cells," runs along the entire length of the membrane and stimulates primary auditory neurons to produce nerve pulses that go back to the cochlear nucleus and from there into the brain through a very large number (thousands) of fibers. These fibers come out of primary auditory neurons connected to inner hair cells and go directly to the brain, so that everything one hears comes out of the inner hair cells. Very fine hairs called stereocilia stick out of the end of the inner hair cells to detect the motion of the membrane, and to act as the transducers that convert deflection of the fine hairs into electrical signals in accordance with deflections of the inner hair cells.

There are three other rows of hair cells called "outer hair cells" that do not transmit sound information for the brain. They are there for automatic gain control. In this particular case, there is three times as much structure dedicated to automatic gain control as there is to sensing the signal in order to develop auditory sensing with a reasonable dynamic range, which for a human is a factor of $10^6$ in amplitude or $10^{12}$ in energy (120 dB).

Figure 8A:
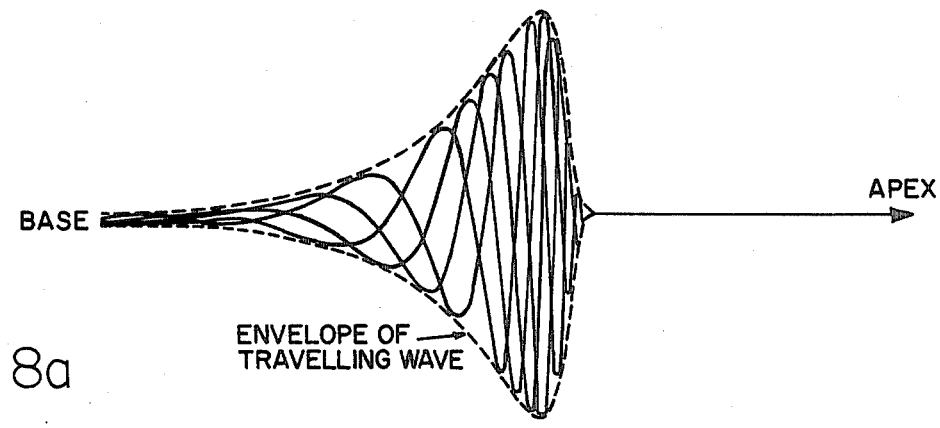
FIG. 8a illustrates the envelope of a traveling wave in the cochlea.
Figure 8B:
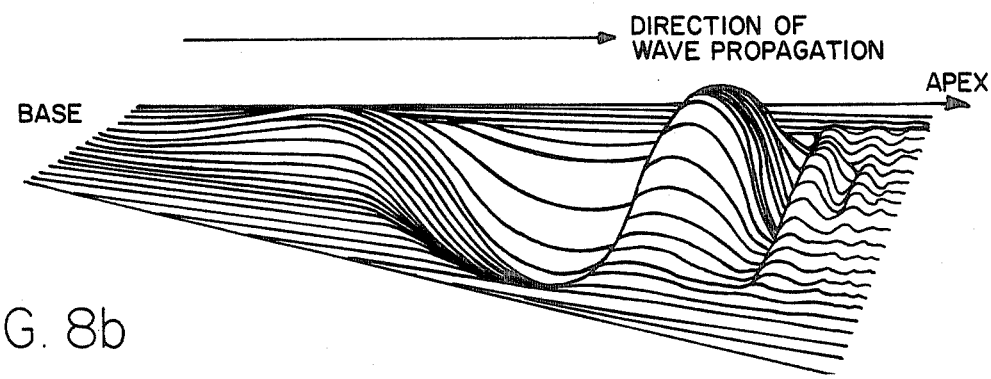
FIG. 8b illustrates a three-dimensional view of a traveling wave in the cochlea.

Consider the behaviour of the cochlea for loud signals when the outer hair cells are not important. Pressure wave signals propagate down the cochlea and create traveling bumps in the basilar membrane. They travel fast at first, and the slow down as they go further along as shown graphically in FIG. 8a. FIG. 8b shows schematically, in a three-dimensional graph, what the basilar membrane might look like with a single frequency sine wave input. Due to this change in speed, a pressure wave has a long wavelength at the basal end of the cochlea. In other words, by the time the oval window has moved a little bit, the previous part of a pressure wave has traveled a long way, since the basilar membrane is very stiff and very tight at the beginning. But as the pressure wave travels along the cochlea, the basilar membrane becomes less stiff and tight, i.e, becomes more limp, so the pressure wave slows down until, at some point, the membrane cannot propagate the wave anymore. Consequently, as the wave travels, it keeps building up energy per unit length which is dissipated in the basilar membrane, the tectorial membrane, and in the inner and outer hair cells in the region near the maximum.

Because of the fact that the cochlea response peaks for any given frequency, there will always be a point where the displacement is maximum. The velocity of the vibration of the hair cells with respect to the tectorial membrane will be a maximum at that point. That will be the point where the hair cells are thrashing back and forth the fastest. And for the size of a hair cell, a small fraction of a micron, the viscosity of the fluid is moderately high. Consequently, the resistance to the motion of the fluid is enough that the micron-size stereocilia sticking out of the inner hair cells get bent as they move back and forth relative to the fluid because of the shearing action between the top of the basilar membrane and the tectorial membrane.

When the stereocilia are pushed one way, the hair cells release neurotransmitters to cause auditory neurons to send out nerve pulses. When the stereocilia are pushed the other way, no pulses are generated. And if the stereocilia are bent to some new position and then left there for a while, the operating point adjusts and the neurons stop sending out nerve pulses. Thereafter, bending the cilia from that new position one way causes nerve pulses, but bending them back again does not, so the inner hair cells act as auto-zeroing half-wave rectifiers for the velocity of the motion of the basilar membrane. For that reason, all of the hearing models assume that the output is a half-wave rectified version of whatever signal is traveling down the basilar membrane.

In summary, the cochlea mechansim senses the velocity of a pressure wave causing the basilar membrane to move up and down. A displacement of one stereocilia by an atomic diameter is enough to send off a nerve pulse. The stereocilia are extremely sensitive.

There are a number of things that can be said about the cochlea transmission mechanism. A traveling wave equation can be written for a fluid with a restoring membrane on it as a differential equation in which the velocity is dependent upon the stiffness of the membrane and the density of the fluid. With all of the hair cells on top of the basilar membrane, that membrane undoubtedly has some damping built into it so that in the absence of intervention from the outer hair cells, the membrane response is damped. In other words, the membrane itself is not a highly resonant structure, primarily because the ear was designed to hear transients.

Outer hair cells in the cochlea have nerve fibers which receive impulses from the brain to control their positive feedback into the basilar membrane. Their function is to reduce the damping of the basilar membrane and thus increase sensitivity to sound. The greater the amplitude of the sound, the lower the positive feedback, and vice versa. Consequently, the net result achieved is a form of automatic gain control over the hearing process that works in the bottom few decades of the hearing range. And making the system more resonant automatically decreases the bandwidth at the same time it increases the gain. As a consequence, noise does not increase as much as the sensitivity is increased by positive feedback.

The outer hair cells can put enough unwanted energy back into the basilar membrane for it to oscillate. Sometimes such oscillation is recognized as momentary ringing, but usually the positive feedback only assists the hearing process by appropriately improving sensitivity at low sound levels. It is only in the case of some malfunction in this positive feedback that there is any permanent ringing that interferes with the hearing process. Such a malfunction is called tinnitus.

Figure 9:
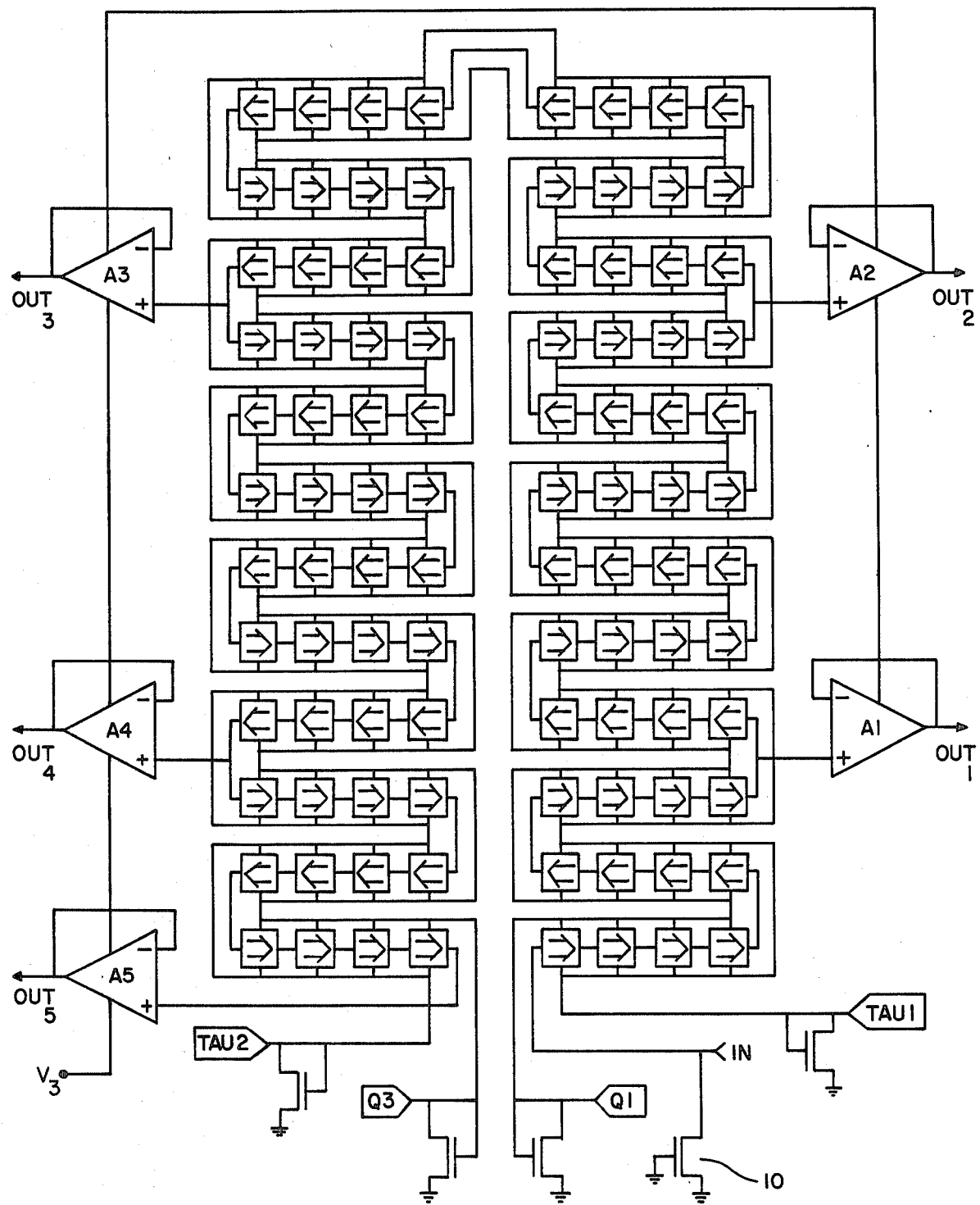
FIG. 9 is a block diagram of an electronically variable delay line implemented with analog integrated circuits and useful as an electrically tuned transmission line for electrical signals in simulating the operation of the cochlea.
Figure 10A:
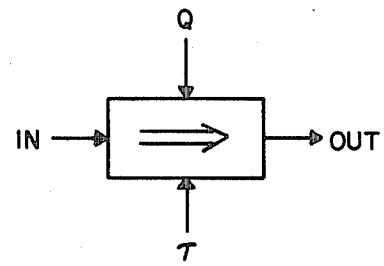
FIG. 10a illustrates the symbol used in FIG. 9 for this circuit.

Having understood the organization and operation of the cochlea, it may be readily appreciated how a VLSI electronically variable delay line described above may be used to emulate the cochlea by electronically adjusting the delays of its individual sections such that each is a multiple of the previous one. To conserve the length of space needed to house the delay line, it may be arranged on a VLSI chip as shown in FIG. 9. Each section of the serpentine delay line is a delay section which may be comprised of a transconductance amplifier driving an integrating capacitor as described with reference to FIG. 1, but is preferably implemented with delay line sections comprised of two cascaded transconductance amplifiers and a feedback transconductance amplifier shown in FIG. 10 and represented in FIG. 9 by a symbol shown in FIG. 10a consisting of a square with an arrow indicating the direction of propagation and two control inputs Q and τ.

The signal input to the serpentine delay line of FIG. 9 is across a CMOS transistor 10 connected to circuit ground to function as a static protection device. This signal is then passed from section to section through 48 sections shown on the right, and another 48 sections shown on the left. In practice, many hundreds of sections may be provided. Only 48 sections are shown on each side for simplification of the illustration.

Signal taps between sections are located at intervals along the delay line to provide outputs, such as OUT 1 through OUT 5. These signal taps are used to measure the responses of the delay line, and are in a most general way analogous to inner hair cells of the cochlea. Transconductance amplifiers A1 through A5 are used as followers to couple out the signals OUT 1 through OUT 5, with output current capability set by the bias voltage $V_c$.

In a more complete synthesis of a cochlea, more output amplifiers would be needed. It is possible even with present VLSI technology $(3\mu)$ to have many hundreds of active sections in the delay line. A working basilar membrane model with 480 active delay sections has been fabricated with the present 3-micron technology in this serpentine form, which preserves a reasonable aspect ratio.

The particular active delay line sections preferably used in a simulation of the cochlea shown in FIG. 9 will now be described with reference to FIG. 10. It is a delay section with positive feedback implemented with two differential amplifiers TA1 and TA2 connected in cascade, with their respective transconductance $G_1$ and $G_2$ controlled together, and each driving separate integrating capacitors $C_1$ and $C_2$, respectively. The latter are implemented with CMOS transistors in the VLSI serpentine delay line of FIG. 9.

The output of the second transconductance amplifier TA2 is fed back to the negative input of the first transconductance amplifier TA1 by a third differential transconductance amplifier TA3 having its own transconductance control signal Q. The result is a delay section with two controls: the TAU ($\tau$) control, which controls the delay introduced by the section, and the Q control which controls the amount of internal positive feedback from the output terminal of the section. The conductors for these controls run along the sides of the sections as polysilicon lines. The two ends of each of the polysilicon control lines are terminated at connector pads TAU1 and TAU2 for the $\tau$ control, and Q1 and Q2 for the feedback control Q. Note that for each pad, there is a transistor connected to circuit ground to serve to convert an externally applied bias current to an appropriate bias voltage.

In each delay section having two conventional follower-integrators in cascade, the capacitance (C) is the same for both integrators (i.e., $C_1=C_2=C$) and the transconductance of both amplifiers TA1 and TA2 are the same: (i.e., $G_1=G_2=G$). Under-damped response is obtained by adding the feedback amplifier TA3, with transconductance $G_3$; its output is proportional to the difference $V_2-V_3$, but the sign of the feedback is positive for small signals $I_3=G_3(V_2-V_3)$.

If the feedback $I_3$ is reduced to zero, each follower-integrator will have a transfer function:

$$\frac{V_2}{V_1} = \frac{V_3}{V_2} = \frac{1}{\tau s + 1} \quad (10)$$

where $\tau=C/G$. Two integrator-followers in cascade give an overall transfer function that is the product of the individual transfer functions:

$$\frac{V_3}{V_1} = \left(\frac{1}{\tau s + 1}\right)^2 \quad (11)$$

Each delay line section is thus implemented with a delay circuit having two poles in the complex s plane, where the two poles are real-valued at $s=-1/\tau$ with no feedback. When the feedback is added, the poles are complex, i.e., the system has less than critical damping.

Figure 10:
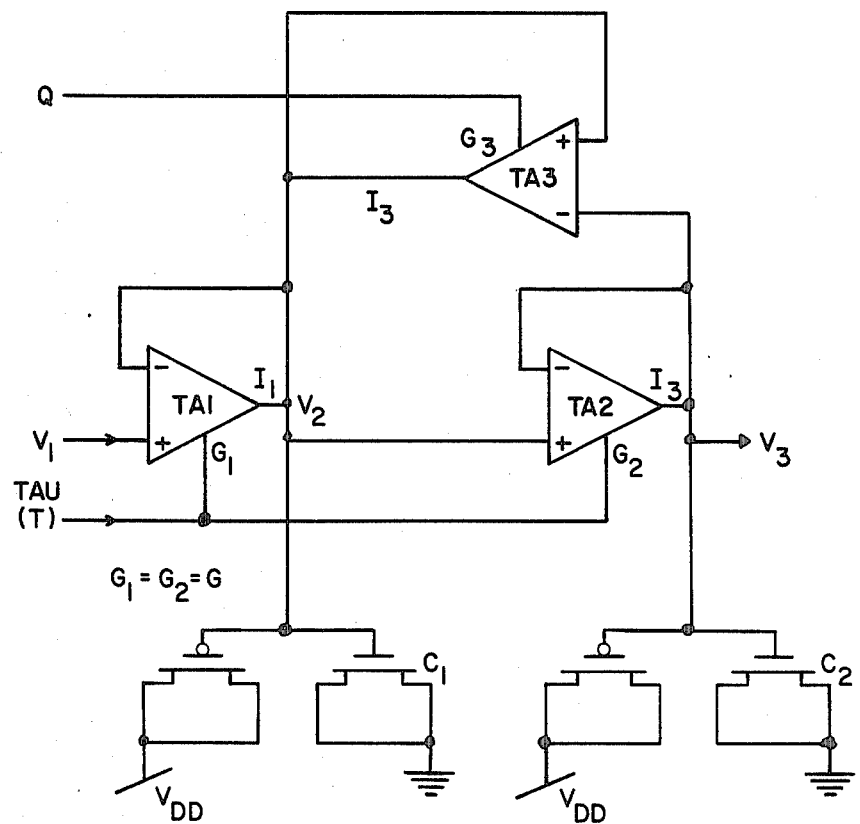
FIG. 10 illustrates a delay section with positive feedback section preferred for the implementation of the electronically tuned transmission line of FIG. 9.

It should be noted that when the serpentine delay line of FIG. 9 is implemented with the circuit illustrated in FIG. 10, there is feedback only between input and output transconductance amplifiers within each delay section, and not between delay sections. Nevertheless, it should be understood that feedback may be provided between sections, but that the arrangement shown in FIG. 10 is preferable.

Each follower-integrator preferably comprises a differential transconductance amplifier shown in FIG. 5. That differential transconductance amplifier takes two input voltages $V_1$ and $V_2$ and generates as its output $I_{OUT}$ a current that is proportional to a function of the difference between the input voltages $V_1$ and $V_2$. A differential transconductance amplifier is thus defined as an amplifier whose output current is proportional to a function of the difference between two input voltages.

To understand the operation of the delay section with postiive feedback shown in FIG. 10, assume the circuit of FIG. 10 is in a quiescent condition with $V_1=V_2=V_3$. If a step increase is introduced in $V_1$, the output $V_2$ of the first follower-integrator starts to go up as the capacitor $C_1$ starts to charge. The output $V_2$ tends to get ahead of the output $V_3$. But if $V_2$ is ahead of $V_3$, the feedback amplifier TA3 controlled by the difference $V_2-V_3$ tends to drive $V_2$ up even faster. This positive feedback can make the circuit unstable under the improper setting of the Q control, as demonstrated by the following analysis.

The output current of the amplifier TA1 is proportional to the difference between its two inputs $V_2$ and $V_1$.

$$I_1 = G_1(V_1 - V_2). \quad (12)$$

Similarly, the output current of the amplifier TA3 is the difference between its two inputs $V_2$ and $V_3$.

$$I_3 = G_3(V_2 - V_3). \quad (13)$$

In order to write an equation for $V_3$ in terms of $V_1$, we first compute $V_3$ from the transfer function of the amplifier TA2 which is just a follower-integrator.

$$V_3 = \frac{V_2}{\tau s + 1}. \quad (14)$$

Combining Equation (13) and Equation (14), we can derive an expression:

$$C\frac{dV_2}{dt} = G_1(V_1 - V_2) + G_3(V_2 - V_3). \quad (15)$$

Using $s=d/dt$ and collecting terms, $$V_2(sC+G_1-G_3)=G_1V_1-G_3V_3. \quad (16)$$

Substituting $V_2$ from Equation (14) and simplifying using $\tau32\ C/G_1$ and $\alpha=G_2/2G_1$, $$\frac{V_3}{V_1} = \frac{1}{\tau^2 s^2 + 2\tau s(1-\alpha) + 1}. \quad (17)$$

Equation (17) is the transfer function for the whole delay section. As expected, it is a second-order equation in $\tau s$ just like a second-order filter transfer function, but the input $\alpha$ controls the feedback transconductance relative to the transconductance of the amplifier going forward.

If $\alpha=0$, the response is simply that of the two first-order sections; the denominator is $(\tau s+1)^2$, as expected. When $\alpha=1$, the center term is zero and the circuit response is $$\frac{V_3}{V_1} = \frac{1}{\tau^2 s^2 + 1} \tag{18}$$

Solution of the equation is then $\tau^2 s^2 = -1$ or $\tau s = \pm j$.

The poles are on the imaginary axis if $\alpha=1$ and on the real axis when $\alpha=0$. For $0<\alpha<1$, the roots are on a circle of radius $1/\tau$, and then $\cos\theta = 1-\alpha$. Upon normalizing the circle to unit diameter by measuring the plane in units of $1/\tau$, then the negative real part of the poles, known as the damping, is $1-\alpha$. The Q of the system is thus $Q=1/(2(1-\alpha))$.

The circuit is unstable when $\alpha>1$ or $G_3 > G_1 + G_2 = 2G_1$. There are two outputs from integrator amplifiers TA1 and TA2 to charge the two capacitors $C_1$ and $C_2$, but there is only one feedback amplifier TA3. Thus, in order to make the whole circuit unstable, amplifier TA3 must provide as much current as the two integrator amplifiers TA1 and TA2 that are providing the damping. Consequently, unstable operation can be avoided by control of $G_3$.

Thus far the delay section has been considered as a linear system for small amplitudes of oscillation. When a large signal is received, the response will become slew-rate limited due to the tanh characteristic of the amplifier.

Under large signal conditions, the range of values of $G_3$ which allow stable operation of the circuit are restricted still further, as demonstrated by the following analysis.

Figure 12:
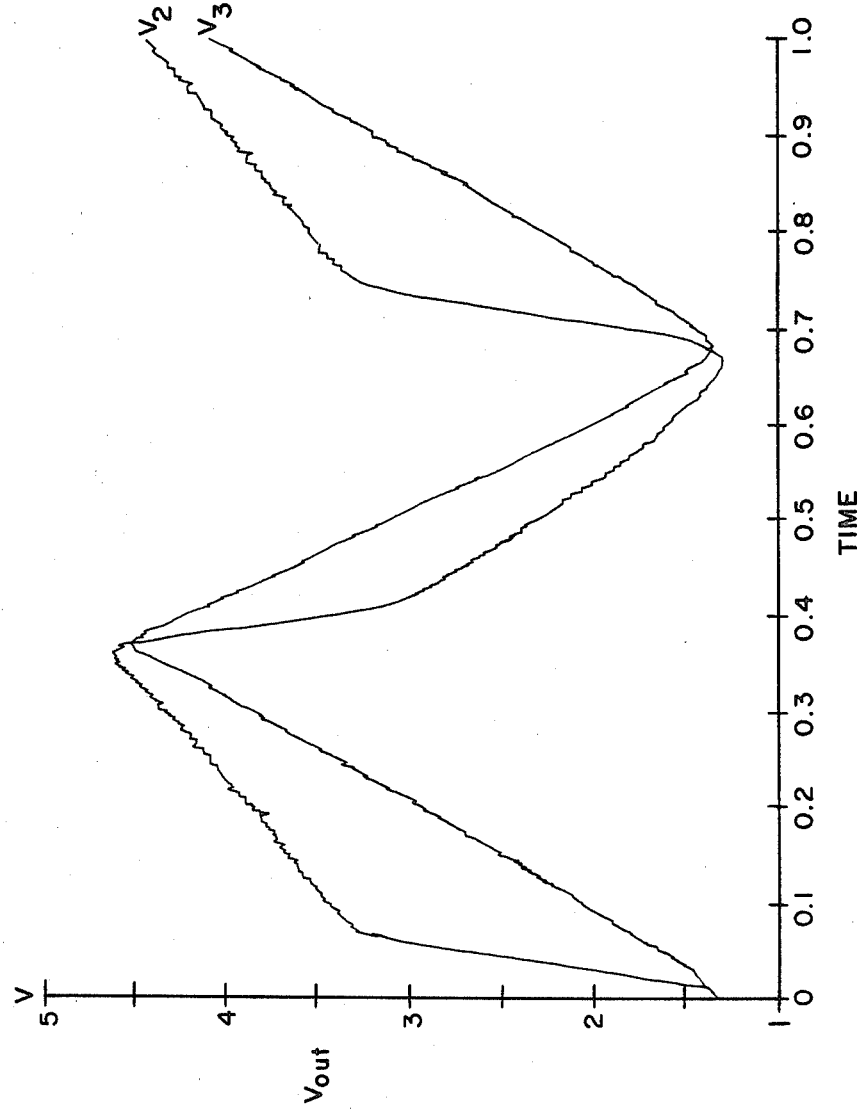
FIG. 12 shows a graph that illustrates the limit-cycle oscillation of the circuit of FIG. 10 when the Q control is set at too high a value.

Referring again to FIG. 10, large-signal oscillation is sustained if $V_2$ reaches $V_{DD}$ before $V_3$ catches up to $V_2$. As the feedback current $I_3$ is decreased, there is a point at which $V_2$ and $V_3$ reach $V_{DD}$ at virtually the same itme. The oscillation waveform under those conditions is shown in FIG. 12, which shows the minimum limit-cycle oscillation of the second-order section for $\alpha \approx 0.81$. Lower settings of $\alpha$ lead to damped response for all amplitudes of input signal. If $I_3$ is decreased below the value shown, oscillation ceases. We can solve for the value of $I_3$ that will just sustain a large-signal limit cycle by assuming that the amplifiers are saturated, equating the time required for $V_2$ to reach $V_{DD}$ with that required by $V_3$ to do so.

The time $t_0$ required for the output voltage $V_2$ to ramp from zero to $V_{DD}$ is the total voltage excursion divided by the rate at which the voltage increases:

$$t_0 = \frac{C_2 V_{DD}}{I_2} \tag{19}$$

Similarly, the time $t_1$ for $V_2$ to reach $V_1$ is:

$$t_1 = \frac{C_1 V_1}{I_3 + I_1} \tag{20}$$

and the time $t_h$ for $V_2$ to ramp from $V_1$ to $V_{DD}$ is:

$$t_h = \frac{C_1(V_{DD} - V_1)}{I_3 - I_1} \tag{21}$$

Marginal oscillation occurs when $$t_1 + t_h = t_0 \tag{22}$$

For the example shown, $V_1 \approx (V_{DD}/2)$, and the result is independent of the value of $V_{DD}$. We assume $I_1=I_2=I$; $C_1=C_2$; and $I_3=2\alpha I$ so that we obtain a dimensionless form of Equation 22:

$$\frac{1}{2\alpha + 1} + \frac{1}{2\alpha - 1} = 2 \tag{23}$$

where, as before, $\alpha=(I_3/2I)$.

Equation 23 can be simplified to:

$$4\alpha^2 - 2\alpha 1 = 0 \tag{24}$$

The solution of which is:

$$\alpha = \frac{1 + \sqrt{5}}{4} = 0.809 \tag{25}$$

or $$I_3 = 1.618\, I$$

The current in the feedback amplifier cannot exceed 1.618 times the current in each forward amplifier if we wish the circuit to be stable for all possible inputs. This condition can be stated as the transconductance of the feedback amplifier is less than 0.809 times the sum of the transconductances of the two cascaded amplifiers constituting the follower-integrators. In the realm of small signals, we could increase that ratio to nearly 1. But small-signal linear behavior is not limiting us here. We are strictly at the mercy of the nonlinearities.

Having described in detail the organization and operation of the delay sections of the serpentine delay line in FIG. 9, with both TAU and Q control, it is readily evident how the electronically variable delay line functions. The TAU and Q controls are run out to each section in polysilicon lines that serpentine along with the sections. As explained hereinbefore, the time-constant of these sections is exponentially related to the voltage on the TAU control line. So, if a different voltage is applied on the two ends of the TAU line, a voltage gradient is produced along the length of the polysilicon line which functions as a voltage dividing network that incrementally alters the voltage control TAU applied to each section in sequence. The delay per section in such a delay line will thus be exponentially related to the position along the line.

The taps on any exponentially-scaled line have the desirable property that their frequency response, when plotted on a logarithmic scale, is scale invariant: the response at any tap is a shifted version of that at an earlier tap. This property is approximately true of the cochlea, and enormously simplifies further processing of output signals from the taps. The peaks of the response of the secondorder line can be made higher by increasing the transconductance of the feedback amplifiers, or by reducing the multiple by which the delay of each stage is increased from that of the preceding stage. By making the voltage on the input end of the TAU line higher than that on the output end, the input end of the delay line is the high frequency (fast) end and the output end is the low frequency (slow) end.

Figure 11:
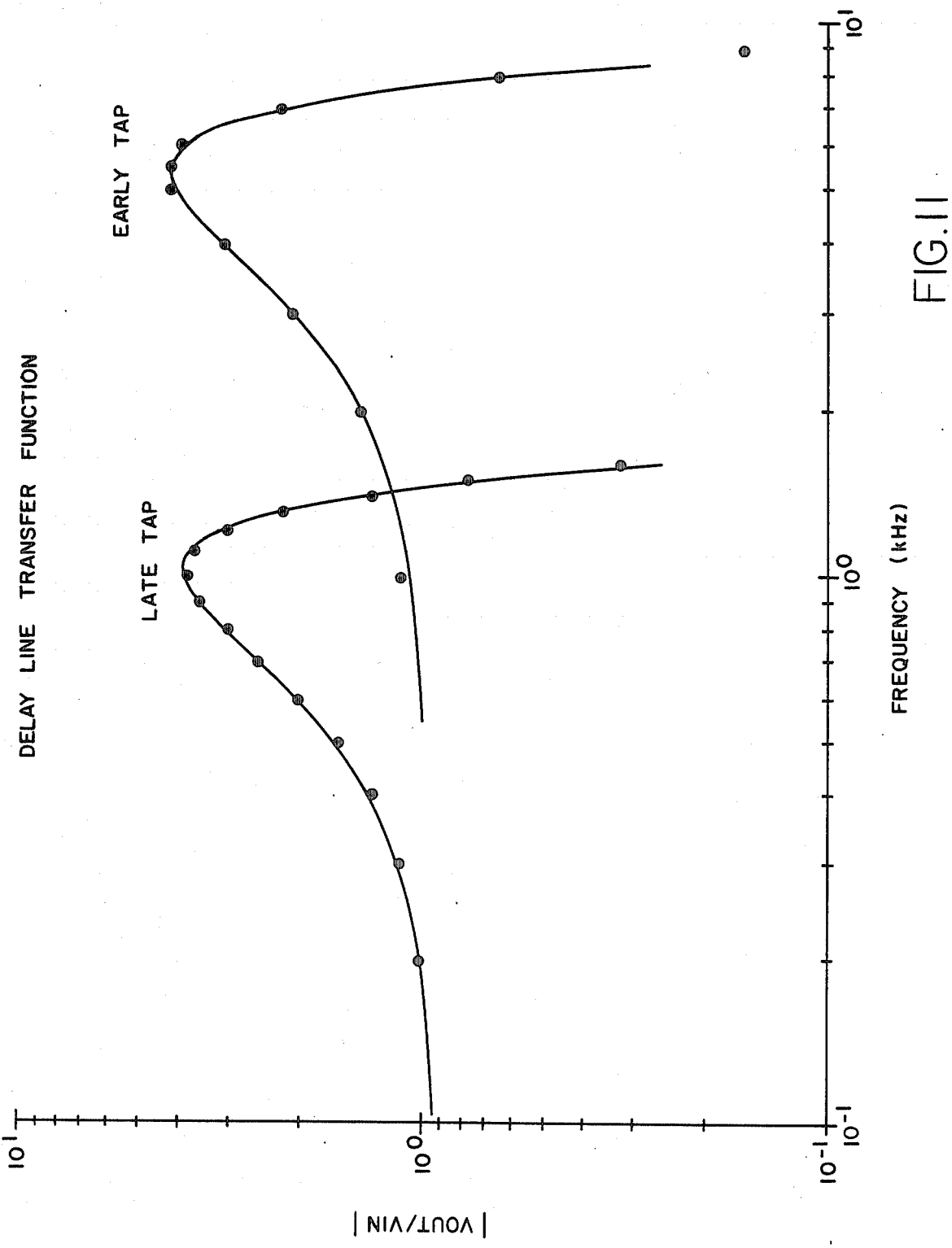
FIG. 11 illustrates in a graph the theoretical and actual response (output amplitude over input amplitude, or gain vs. frequency) at two taps of the delay line of FIG. 9 implemented with the delay sections of FIG. 10.

FIG. 11 shows the frequency response at two taps of the transmission line, an early tap and a late tap. What has been plotted is the log of the response amplitude as a function of the log of the frequency. For this application, second-order delay sections with Q values near 1 are used ($\alpha = \frac{1}{2}$), which means that the peak is very broad and has a maximum value just slightly greater than 1. Each stage delay was adjusted to be approximately 1.05 times that of its predecessor. The feedback of the second-order line was below the limit imposed by the large signal stability considerations.

Each second-order section has a similar response curve. Since the time-constant of each section is larger than that of its predecessor by a constant factor, each curve will be shifted on the log plot by a constant amount. The overall response is the product of all of the individual curves. The log is therefore the sum of all of the logs. Let us compute the response from the input up to a theoretical 100th tap. We take the response of the first section, times the response of the second, times the response of the third, . . . , until we get up to the 100th tap. And these response curves all look the same, except each is shifted over from the last. So the log curves are added up. Each individual response curve has a maximum gain only very slightly larger than unity. Each response curve is shifted over from the other by an amount that is small compared with the width of the peak. Although there is not much gain in each section, by the time they are cascaded, each one shifted over just a little from the next one, there is a large peak in the response. This phenomenon is not the resonance of any one section. It is the collective behaviour of many sections, each amplifying at one range of frequencies the behaviour from the sections before them. And so this peak is not the result of energy stored in one place, coherently, but the result of a signal traveling through a number of sections, each one of which reinforces the last one. In FIG. 11, the solid curves are the theoretical response, determined as described above. The dots are the measured response of an actual delay line.

The invention has been presented with near perfect devices in mind. At the present state of CMOS technology, the devices are far from perfect. For a given gate voltage, the current can vary by about a factor of two between adjacent transistors. Consequently, there is a dispersion in the center frequencies of the sections due to the fact that there is this random variation in threshold. The Q's vary also, because the Q control is a transistor and the threshold of that transistor varies randomly. Moreover, the Q adjustment is not correlated very well with the $\tau$ adjustment on the same stage. So, in practice, there will be a certain amount of random variation.

If too many sections are present whose response falls off without having a peak in it, then the response will get depressed at high frequencies and it will not be possible to maintain the desired bandwidth of the delay line. It will not be possible to increase Q too much to make up for that, because some sections may start oscillating. However, there is a range of variations within which this delay line will work reasonably close to what is expected to emulate the cochlea where the input sound is represented by an electrical signal, possibly derived from a sound transducer. Fortunately, ordinary CMOS processes are capable of producing sufficiently wellcontrolled currents that good cochlear behaviour can be obtained with no oscillation.

The results shown in FIG. 11 verify that real circuits can function collectively nearly as the idealized theory predicts.

In order for the delay line to function as described, Q must be greater than 0.707 corresponding to $\alpha$ greater than 0.293, and the variation must be less than $1.809/0.293 = 2.76$ to avoid large signal instability.

Although particular embodiments of the invention have been described and illustated herein, it is recognized that modifications and variations may readily occur to those skilled in the art. Consequently, it is intended that the claims be interpreted to cover such modifications and variations.

What is claimed is:

1. An electronically variable active analog delay line comprising a plurality of delay sections connected in cascade, each section comprising
   a transconductance amplifier having an input terminal, an output terminal, and a transconductance control terminal, said input terminal being connected to the output terminal of a preceding transconductance amplifier,
   an integrating capacitor connected between said output terminal and a source of fixed voltage whereby each section functions as a single time-constant integrator the time-constant characteristic of which is electronically controlled by an electrical signal applied to said transconductance control terminal, and
   means for applying an electrical signal representative of the time-constant characteristic desired of the section to said control terminal.

2. An electronically variable active analog delay line as defined in claim 1 wherein said transconductance amplifier comprises a differential transconductance amplifier having a second input terminal for forming at said output terminal an output signal proportional to the voltage difference $V_1 - V_2$, where $V_2$ is a feedback signal applied to said second input terminal from said output terminal, and $V_1$ is an input signal to the delay section.

3. An electronically variable active analog delay line as defined in claim 1 or 2 wherein said means for applying an electrical signal to said control terminal of each delay section is comprised of a conductor having two ends and distributed resistance along its length between said two ends, and said control terminals of said delay sections are connected to said conductor at distributed points, and means for applying one voltage at one end of said conductor while applying another voltage at the other end of said conductor, whereby said conductor produces a voltage gradient along the length thereof to produce a time-constant characteristic for each delay section in cascade which varies as a function of the position of each delay section in said delay line.

4. An electronically variable active analog delay line as defined in claim 1, 2 or 3 including means for coupling at least one additional signal into said delay line at a predetermined point along said delay line to be combined with a signal propagating through said delay line, said coupling means being connected to said integrating capacitors of a differential transconductance amplifier of a section at said predetermined point.

5. An electronically variable active analog delay line as defined in claim 4 wherein said coupling means comprises a capacitor.

6. An electronically variable active analog delay line as defined in claim 4 wherein said coupling means comprises an amplifier having its output connected at said predetermined point.

7. An electronically variable active analog delay line as defined in claim 6 wherein said amplifier is a transconductance amplifier having a control terminal for receiving a signal to control the transconductance thereof.

8. An electronically variable active analog delay line as defined in claim 6 wherein said amplifier is a differential transconductance amplifier, and the signal coupled into said delay line consists of the difference between two voltages.

9. An electronically variable active analog delay line as defined in claim 8 including a second delay line having a plurality of delay sections and substantially the same velocity of propagation for a second signal propagating therethrough as the first delay line, wherein the signal coupled into said first delay line consists of the difference between the input and output signals of a delay section in said second delay line.

10. An electronically variable active analog delay line comprising a plurality of delay sections connected in cascade, each delay section comprising
  first and second cascaded differential transconductance amplifiers, each having
    a negative input terminal, a positive input terminal, and an output terminal,
    a feedback connection from said output terminal to said negative input terminal,
    a transconductance control terminal for control of the transconductance thereof,
    a capacitor connected between said output terminal and source of fixed voltage,
  a third differential transconductance amplifier having a positive input terminal, a negative input terminal, and an output terminal, said output terminal of said third amplifier being connected to both said output terminal of said first amplifier and said positive input terminal of said third amplifier, and said output terminal of said second amplifier being connected to said negative input terminal of said third amplifier, and
  means for controlling the transconductance of said third amplifier for control of positive feedback from said second amplifier to said first amplifier.

11. An electronically variable active analog delay line comprising a plurality of cascaded delay sections, each section comprising first and second cascaded follower-integrators and means for positive feedback from said second to said first integrator-follower, each follower-integrator comprising a differential transconductance amplifier with negative feedback for charging a capacitor C at the output terminal thereof in accordance with the equation:

$$C \frac{dV_{out}}{dt} = I_G \tanh(V_{in} - V_{out})$$

where $I_G/G = kt/q\kappa$ and G is a transconductance parameter set by a first bias voltage, and a control line having distributed resistance for proportioning said first bias voltage applied to each section in accordance with the position of said section in a delay line for control of delay per section of the line.

12. An electronically variable active analog delay line as defined in claim 11 wherein said transconductance of said third amplifier for positive feedback is less than 0.809 times the sum of the transconductance of said first and second amplifiers.

13. An electronically variable active analog delay line as defined in claim 12 wherein said means for positive feedback comprises a differential transconductance amplifier connected to provide positive feedback in accordance with the equation $I_3 = G_3 \tanh(V_2 - V_3)$ where $G_3$ is a transconductance parameter set by a second bias voltage applied to each section, and a second control line having distributed resistance for proportioning said feedback bias voltage applied to each section in accordance with the position of said section in a delay line for control of internal feedback per section of the delay line.

14. An electronically variable active analog delay line as defined in claim 12 or 13 wherein said first bias voltage applied to each section is controlled by a first voltage at one end of said first control line and a second voltage at the other end of said first control line, whereby the gradient of said first bias voltage from one section to the next may be controlled by varying either said first or second voltage, or both, to a desired increment value including zero.

15. An electronically variable active analog delay line as defined in claim 14 wherein said second bias voltage applied to each section is controllable by a first controllable voltage at one end of said second control line and a second controllable voltage at the other end of said second control line, whereby the gradient of bias voltage for said second bias voltage from one section to the next may be controlled by varying either said first or second controllable voltage, or both, to a desired increment value, including zero.

16. An electronically variable active analog delay line as defined in claim 13 wherein said second bias voltage applied to each section is controllable by a first controllable voltage at one end of said second control line and a second controllable voltage at the other end of said second control line, whereby the gradient of bias voltage for said second bias voltage from one section to the next may be controlled by varying either said first or second controllable voltage, or both, to a desired increment value, including zero.

17. An electronically variable active analog delay line as defined in claim 13 wherein the transconductance of said positive feedback transconductance amplifier is less than 0.809 times the sum of the transconductance of said first and second amplifiers.

* * * * *